(12) United States Patent
Prasher

(10) Patent No.: US 6,365,821 B1
(45) Date of Patent: Apr. 2, 2002

(54) THERMOELECTRICALLY COOLING ELECTRONIC DEVICES

(75) Inventor: Ravi Prasher, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/624,156

(22) Filed: Jul. 24, 2000

(51) Int. Cl.$^7$ ............................................... H01L 37/00
(52) U.S. Cl. ....................................... 136/201; 136/242
(58) Field of Search ............................... 136/200–242; 62/3.3

(56) References Cited

FOREIGN PATENT DOCUMENTS

EP           447020     *  9/1991

OTHER PUBLICATIONS

Min, Gao, Row, D.M. and Volkein, F., Integrated thin film thermoelectric cooler, Electronics Letters, Jan. 22, 1998, vol. 34, No. 2.*

Rama Venkatasubramanian, "Thin–Film Superlattice and Quantum–Well Structures—A New Approach to High–Performance Thermoelectric Materials", *Naval Research Reviews*, Center for Superconductor Research, Research Triangle Institute, 1996 *No month available.

* cited by examiner

*Primary Examiner*—Bruce F. Bell
*Assistant Examiner*—Thomas H Parsons
(74) *Attorney, Agent, or Firm*—Trop, Pruner & Hu, P.C.

(57) ABSTRACT

A thermoelectric cooler utilizing superlattice and quantum-well materials may be deposited directly onto a die using thin-film deposition techniques. The materials may have a figure-of-merit of greater than one.

19 Claims, 1 Drawing Sheet

THERMOELECTRICALLY COOLING ELECTRONIC DEVICES

BACKGROUND OF THE INVENTION

1. Field of the Invention

This invention relates generally to thermoelectric cooling of electronic devices.

2. Description of the Related Art

Heat generated during processor operation may adversely effect the processor's performance and may damage the processor. Thus, it is desirable to keep processors and other heat generating electronic devices cool. Cooling processors may increase processor performance and decrease the potential for damage.

Traditional methods of cooling may either be impractical for use with small devices, such as microprocessors, or may be practical but inefficient. For example, cooling a processor by conduction may not produce sufficiently low temperatures due to resistance from the components used in the cooling process. Moreover, refrigeration cooling may produce sufficiently cool temperatures but the volume of cooling solution and amount of accompanying hardware do not make this system practical for use with small devices, such as a microprocessor.

Thermoelectric cooling, for example by a Peltier device, may be practical for use in small electronic devices because the Peltier devices are compact. Generally, when a current is applied to a Peltier-type thermoelectric cooling device, it will absorb-heat from one surface of the electronic device and release the heat somewhere else. Traditional thermoelectric coolers however may require a lot of power. This may make these coolers inefficient. Especially when the device being cooled is battery powered, such coolers may be impractical.

Thus, there is a need for more efficient ways of thermoelectric cooling electronic devices.

DETAILED DESCRIPTION OF THE INVENTION

Figure 1:
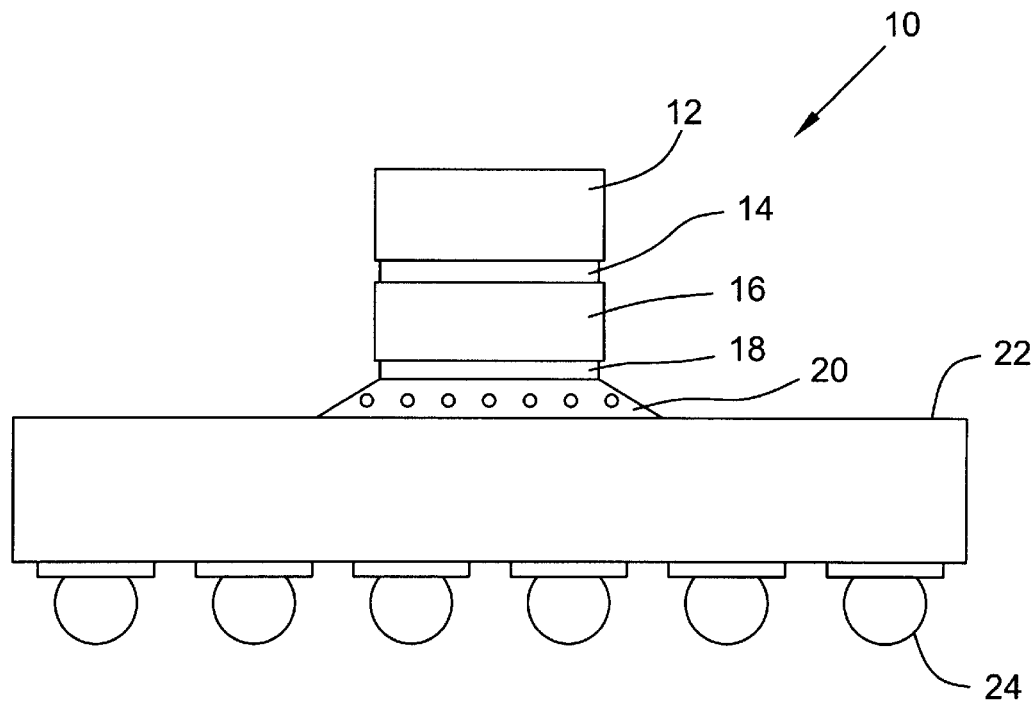
FIG. 1 is a greatly enlarged front elevational view of one embodiment of the present invention showing the packaged and cooled die.

An electronic device 10, illustrated in FIG. 1, may include a die 18 utilizing a package 22. According to one embodiment of the invention, the package 22 may be an organic land grid array package (OLGA). However, other packaging techniques may be utilized. A layer of underfill between the package 22 and the die 18 couples the die 18 to the package 22. Solder bumps 24 may be used to electrically and mechanically couple the die 18 to a circuit board (not shown) using surface mount techniques.

A thermoelectric cooler (TEC) 16 may be formed directly on the die 18. The TEC 16 may be made from thin-film superlattice and quantum-well structures. Such structures may use materials having a figure-of-merit or ZT value of greater than one. The figure-of-merit ZT is expressed as follows:

$$ZT=(\alpha^2\sigma/K)T$$

where

α is the Seebeck coefficient;

σ is the electrical conductivity;

K is the sum total of the lattice and electronic components of thermal conductivity; and T is the temperature (°K).

In general, superlattices may be comprised of alternating thin layers of P-type and N-type semiconductor materials. These alternating layers may be barrier layers and quantum-well layers. In one embodiment of the present invention, alternating layers of $Bi_2Te_3$ and $Sb_2Te_3$ may be utilized in forming a superlattice quantum-well structure. At 300 K, the ZT of these layers may be from about 1.7 to about 2.3. The alternating layers may be of the same thickness or the $Sb_2Te_3$ layer may be made thicker than the $Bi_2Te_3$ layer. The composite thickness of the alternating layers may be about 500 microns and the individual layers may be from 20 to 200 Angstroms in thickness.

Thermoelectric coolers 16 utilizing superlattice and quantum-well structures may have higher ZT values, and thus, they may produce a more efficient thermoelectric cooler than the traditional thermoelectric coolers. With an increased cooling efficiency comes a decrease in temperature and hence a faster electronic device. Moreover, depositing the TEC 16 directly onto the die 18 may result in a substantial reduction in temperature at the die 18/TEC 16 interface. As a result, the leakage power consumption of the die 18 may also be reduced.

The thin-film TEC 16 may be directly deposited onto the die 18 using techniques such as molecular beam epitaxy (MBE) and metal organic chemical vapor deposition (MOCVD). MBE and MOCVD are vapor deposition techniques used to deposit layers of materials on a substrate at the atomistic level. The materials deposited onto the die may be any materials with sufficiently high ZT values such as $Bi_2Te_3/Sb_2Te_3$, as one example.

A thermal interface material 14 may be positioned between the thermoelectric cooler 16 and a heat pipe 12. Thus, as the TEC 16 draws heat away from the die 18, the heat pipe 12 in turn may remove heat from the thermoelectric cooler 16 and release it away from the die 18. In this way, the heat produced by the die 18 may be continually removed by maintaining a temperature gradient across the TEC 16. Thus, the die 18 may be kept cool, which may prevent it from sustaining damage while improving its performance.

Figure 2:
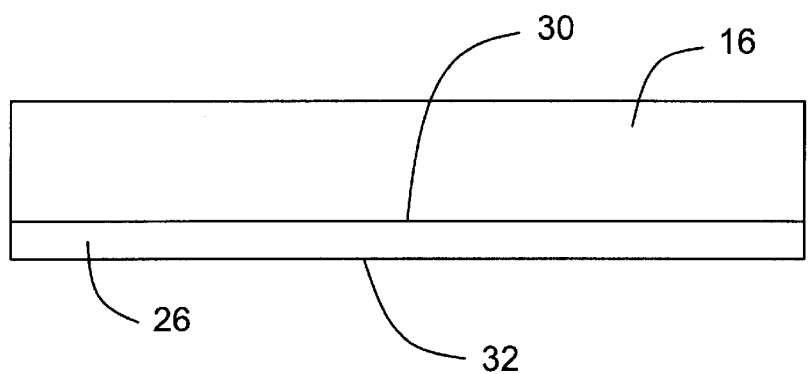
FIG. 2 is a reduced front elevational view of a semiconductor wafer in the course of fabrication.

In one embodiment of the present invention, the die 18 and the thermoelectric cooler 16 may formed from a semiconductor wafer 26, as shown in FIG. 2. The semiconductor wafer 26 may have a front side 32 and a back side 30. The back side 30 of the wafer 26 receives the deposition of alternating layers of high ZT material using a thin-film deposition technique such as MBE or MOCVD. The wafer 26 may be singulated into dice and a die 18 may be attached with its front side 32 coupled to the package 22.

Because MBE or MOCVD may be employed to deposit the thermoelectric cooler material, there is no need for the use of thermal interface material between the TEC 16 and the die 18. That is, because the thermoelectric cooler material may be deposited on the wafer 26 at the atomistic level, there is no need for an interface material. Moreover, because the TEC 16 and the die 18 are effectively integral there is little, if any, interfacial resistance to thermal conduction. Thus, the die 18 may maintain a cooler operating temperature.

Deposition of the thermoelectric cooler material may occur in much the same way other layers are deposited on the front side 32 of a wafer during conventional integrated circuit fabrication process. Thus, thermoelectric cooler 16 fabrication steps may take place during fabrication of the wafer that results in the die 18. Moreover, due to its compactness, the thin-film TEC 16 may contribute to a compact package height that is ideal for use in small electronic devices.

Using the techniques described herein, junction temperatures more than fifty percent lower than that achieved with conventional cooling techniques may be achieved in some embodiments. The temperature of the cold junction of the thin film TEC 16 may be much lower than that achieved with traditional thermoelectric cooling with the same heat removal. For example, based on modeling, temperatures of approximately 50° C. may be achieved. At such temperatures, the leakage power consumption of an electronic device 18, such as a processor, may be significantly reduced.

Moreover, the savings in leakage power consumption may be sufficient to compensate for or to balance the power used for thermoelectric cooling. Thus, improved results may be achieved either without increasing or without substantially increasing the power consumption of the electronic device and cooling system. Moreover, because a thermal interface material is dispensed with, the temperature of the die surface is effectively that of the junction of the TEC 16.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

fabricating a die with a front side and a back side; and directly depositing a thermoelectric material on the back side of the die.

2. The method of claim 1 including depositing a thermoelectric material with a figure-of-merit that is greater than one.

3. The method of claim 2 including depositing a thermoelectric material that has a superlattice and quantum-well structures.

4. The method of claim 3 wherein depositing includes depositing alternating layers of $Bi_2Te_3$ and $Sb_2Te_3$.

5. The method of claim 3 wherein depositing includes forming a thermoelectric material of about 500 microns thickness.

6. The method of claim 1 including depositing using a thin-film deposition technique.

7. The method of claim 6 wherein depositing includes using molecular beam epitaxy.

8. The method of claim 6 wherein depositing includes using metal organic chemical vapor deposition.

9. The method of claim 1 including depositing the thermoelectric material during fabrication of the die.

10. An electronic device comprising:

a die with a front side and a back side; and a thermoelectric cooling material directly deposited on the back side of the die.

11. The device of claim 10 wherein the thermoelectric material has a figure of merit that is greater than one.

12. The device of claim 11 wherein the thermoelectric material has a superlattice and quantum-well structures.

13. The device of claim 12 wherein the superlattice and quantum-well structures includes alternating layers of $Bi_2Te_3/Sb_2Te_3$.

14. The device of claim 12 wherein the thermoelectric cooling material is 500 microns thick.

15. The device of claim 10 wherein said die includes a processor.

16. A processor comprising:

a die directly coated on its back side with a thermoelectric cooling material having a figure-of-merit of greater than one; and a package coupled to the die.

17. The processor of claim 16 wherein the thermoelectric material has a superlattice and quantum-well structures.

18. The processor of claim 17 wherein the superlattice and quantum-well structures includes alternating layers of $Bi_2Te_3/Sb_2Te_3$.

19. The processor of claim 16 wherein the thermoelectric cooling material is about 500 microns thick.

* * * * *